United States Patent [19]

Beinglass et al.

[11] Patent Number: 5,695,819

[45] Date of Patent: Dec. 9, 1997

[54] METHOD OF ENHANCING STEP COVERAGE OF POLYSILICON DEPOSITS

[75] Inventors: Israel Beinglass, Sunnyvale; Mahalingam Venkatesan, San Jose, both of Calif.

[73] Assignee: Applied Materials, Inc., Santa Clara, Calif.

[21] Appl. No.: 641,703

[22] Filed: May 2, 1996

Related U.S. Application Data

[63] Continuation of Ser. No. 253,182, Jun. 2, 1994, abandoned, which is a continuation of Ser. No. 171,866, Dec. 22, 1993, abandoned, which is a continuation of Ser. No. 924,124, Aug. 3, 1992, abandoned, which is a continuation-in-part of Ser. No. 742,954, Aug. 9, 1991, abandoned.

[51] Int. Cl.[6] ............................................. C23C 16/24
[52] U.S. Cl. .................. 427/255; 427/248.1; 437/233; 437/919; 437/967
[58] Field of Search ............................ 427/248.1, 255, 427/255.1; 437/233, 919, 967

[56] References Cited

U.S. PATENT DOCUMENTS

| | | |
|---|---|---|
| 3,900,597 | 8/1975 | Chruma et al. . |
| 4,341,818 | 7/1982 | Adams et al. ............... 437/239 |
| 4,404,236 | 9/1983 | Komatsu et al. . |
| 4,431,460 | 2/1984 | Barson et al. ............... 437/187 |
| 4,745,088 | 5/1988 | Inoue et al. . |
| 4,897,360 | 1/1990 | Guckel et al. ............... 437/60 |
| 4,963,506 | 10/1990 | Liaw et al. . |
| 4,977,104 | 12/1990 | Sawada et al. ............... 437/162 |
| 5,037,666 | 8/1991 | Mori . |
| 5,064,779 | 11/1991 | Hasegawa .................. 437/109 |
| 5,135,607 | 8/1992 | Hirai ........................ 427/255 |
| 5,141,892 | 8/1992 | Beinglass .................. 437/162 |

OTHER PUBLICATIONS

Morosanu, C.E. Thin Films by Chemical Vapor Depostion, Elsevier 1990 p. 107.
Schuegraf, K.K. Handbook of Thin Film Depostion Processes and Techniques Noyes Publications 1988 pp. 80–81.
Kern, W. et al. "Advances in deposition processes for passivation films" J. Vac. Sci. Technol. vol. 14 No. 5 Sep./Oct. 1977 pp. 1082–1099.

*Primary Examiner*—Roy V. King
*Attorney, Agent, or Firm*—Lawrence Edelman; Birgit E. Morris

[57] ABSTRACT

A thermal decomposition CVD method is provided for forming a polysilicon layer over a stepped surface on a semiconductor wafer. The method includes introducing a continuous flow of silicon precursor gases into a vacuum chamber, and adjusting the flow rates and concentrations of the precursor gases, adjusting the temperature and adjusting the pressure within the vacuum chamber so as to control the growth rate of the polysilicon layer on the substrate to between about 500 angstroms/minute and about 2000 angstroms/minute. In a preferred embodiment of the invention, the growth rate of the polysilicon layer is controlled by adjusting the precursor gas flow rates, the temperature and the pressure to between about 1000 angstroms/minute and about 1500 angstroms/minute with the result that the average step coverage of the polysilicon layer is greater than about 95 percent.

12 Claims, 1 Drawing Sheet

METHOD OF ENHANCING STEP COVERAGE OF POLYSILICON DEPOSITS

RELATED APPLICATIONS

This is a continuation of U.S. application Ser. No. 08/253,182 filed Jun. 2, 1994, now abandoned, which is a continuation of U.S. application Ser. No. 08/171,866 filed Dec. 22, 1993, now abandoned, which is a continuation of U.S. application Ser. No. 07/924,124 filed Aug. 3, 1992, now abandoned, which is a continuation-in-part of U.S. application Ser. No. 07/742,954 filed Aug. 9, 1991, now abandoned.

FIELD OF THE INVENTION

This invention relates generally to a method for depositing silicon onto a substrate and particularly to a method of depositing polysilicon onto a substrate having a stepped surface.

BACKGROUND OF THE INVENTION

The deposition of polysilicon onto a substrate is a step often required in the fabrication of semiconductor devices used as components in integrated circuits.

There is a wide variety of methods employed in the industry to accomplish the deposition of polysilicon onto a substrate. The most common method is by chemical vapor deposition ("CVD"). In one type of CVD process, silicon precursor gases are thermally decomposed in a vacuum chamber and polysilicon is deposited onto wafers disposed within the chamber. This thermal decomposition CVD process is relatively simple and inexpensive to operate. It is, however, relatively slow and inflexible. In another prior art CVD process, silicon precursor gases are first converted into a plasma to form highly active excited molecules, atoms, ions and radicals. In such "plasma assisted" CVD methods, the deposition of polysilicon can be faster and more flexible than the thermal decomposition CVD processes. However, plasma assisted CVD methods for depositing silicon are generally not appropriate for fabricating semiconductor wafers used in integrated circuits because the silicon films are highly hydrogenated. Such hydrogenated silicon films tend to be inferior to nonhydrogenated films with respect to conductivity properties and chemical stability.

In parent U.S. patent application Ser. No. 07/742,954 filed Aug. 9, 1991, now abandoned, one of us (Beinglass) disclosed a novel thermal decomposition CVD process capable of depositing polysilicon at markedly higher growth rates than prior art CVD methods. The high growth rates of this new thermal decomposition CVD process make it commercially practical to deposit polysilicon on one semiconductor substrate at a time, rather than in batches of 150 or more. Preparing polysilicon-covered substrates one at a time greatly increases the precision and flexibility achieved over conventional thermal decomposition CVD processes of the prior art. This is very important in today's more complex chip market.

No matter what method is used to deposit polysilicon on the substrate surface, a problem frequently arises as to how to uniformly deposit the polysilicon on substrates having a "stepped" surface. A "stepped" surface as used in this application means a surface having two or more parallel components which are not disposed in the same horizontal plane. For example, stepped surfaces are found on a semiconductor wafer either when one or more trenches are etched into a flat wafer surface, or when conductive lines are deposited and patterned onto the surface.

The deposition of polysilicon onto a stepped surface presents the problem of how to deposit the polysilicon on the vertical aspect of the surface with the same thickness as the polysilicon deposited on the horizontal aspect of the surface. With most methods used in the prior art, the tendency is for the silicon to deposit on the vertical aspect of the surface to a lesser extent than on the horizontal aspect. Thus, the polysilicon layer on the vertical surface is thinner than the polysilicon layer on the horizontal surface. This problem is especially acute in the deposition of silicon onto stepped surfaces having an aspect ratio greater than 1.0. (As used in this application, the term "aspect ratio" refers to the ratio of the vertical height of the step to its width.)

Several methods have been proposed in the prior art for uniformly depositing polysilicon onto stepped surfaces, but none of them have been found to be satisfactory. They are generally too slow, difficult to implement, complex and/or expensive. In addition, there is a need to utilize the high growth rates for single wafer thermal decomposition CVD methods disclosed in parent application Ser. No. 07/742,954 referred to above in order to obtain uniform deposits of polysilicon over a stepped surface. Thus a method for depositing silicon at the high deposition rates useful in the processing of single semiconductor substrates in a vacuum chamber but with improved step coverage (ratio of the polysilicon thickness on the vertical surface to the polysilicon thickness on the horizontal surface) would be highly desirable.

SUMMARY OF THE INVENTION

We have found that improved step coverage can be achieved by controlling the silicon deposition rate. The invention is a thermal decomposition CVD method for forming a silicon layer over a stepped surface of a semiconductor substrate. The method comprises introducing a continuous flow of silicon precursor gases into a vacuum chamber, and adjusting the flow rates, the concentrations of the precursor gases, the temperature and the pressure within the vacuum chamber so as to control the growth rate of the polysilicon layer on the substrate to between about 500 angstroms/minute and about 2000 angstroms/minute. In a preferred embodiment of the invention, the growth rate of the polysilicon layer is controlled between about 1000 angstroms/minute and about 1500 angstroms/minute. In a preferred embodiment of the invention, the growth rate of the polysilicon layer is controlled so that the average step coverage of the polysilicon layer is greater than about 80 percent and most preferably 95 percent or higher.

In one embodiment of the invention, the growth rate of the polysilicon layer is controlled by maintaining the chamber temperature between about 635° C. and 645° C. and by maintaining the chamber pressure at about 140 Torr. In another embodiment, the growth rate is controlled by maintaining the temperature between about 660° C. and 680° C. and by maintaining the chamber pressure at about 80 Torr.

In a preferred embodiment of the invention, the above-described steps of the invention are applied to a single wafer disposed within the vacuum chamber.

BRIEF DESCRIPTION OF THE DRAWINGS

These and other features, aspects and advantages of the present invention will become understood with reference to the following description, appended claims and accompanying drawings, wherein:

DETAILED DESCRIPTION OF THE INVENTION

The invention is a thermal decomposition CVD method for forming a polysilicon layer over a stepped surface on a semiconductor substrate. The method of the invention comprises introducing a continuous flow of silicon precursor gases into a vacuum chamber while adjusting the flow rates and concentrations of the precursor gases and the temperature and the pressure within the vacuum chamber so as to control the growth rate of the polysilicon layer on the substrate to between about 500 angstroms/minute and about 2000 angstroms/minute.

In a typical embodiment, the stepped surface of the semiconductor wafer has an aspect ratio greater than about 1.0. However, the method is effective for more extreme stepped surfaces, such as those having an aspect ratio greater than about 2.5 or even greater than about 5.0.

Figure 1:
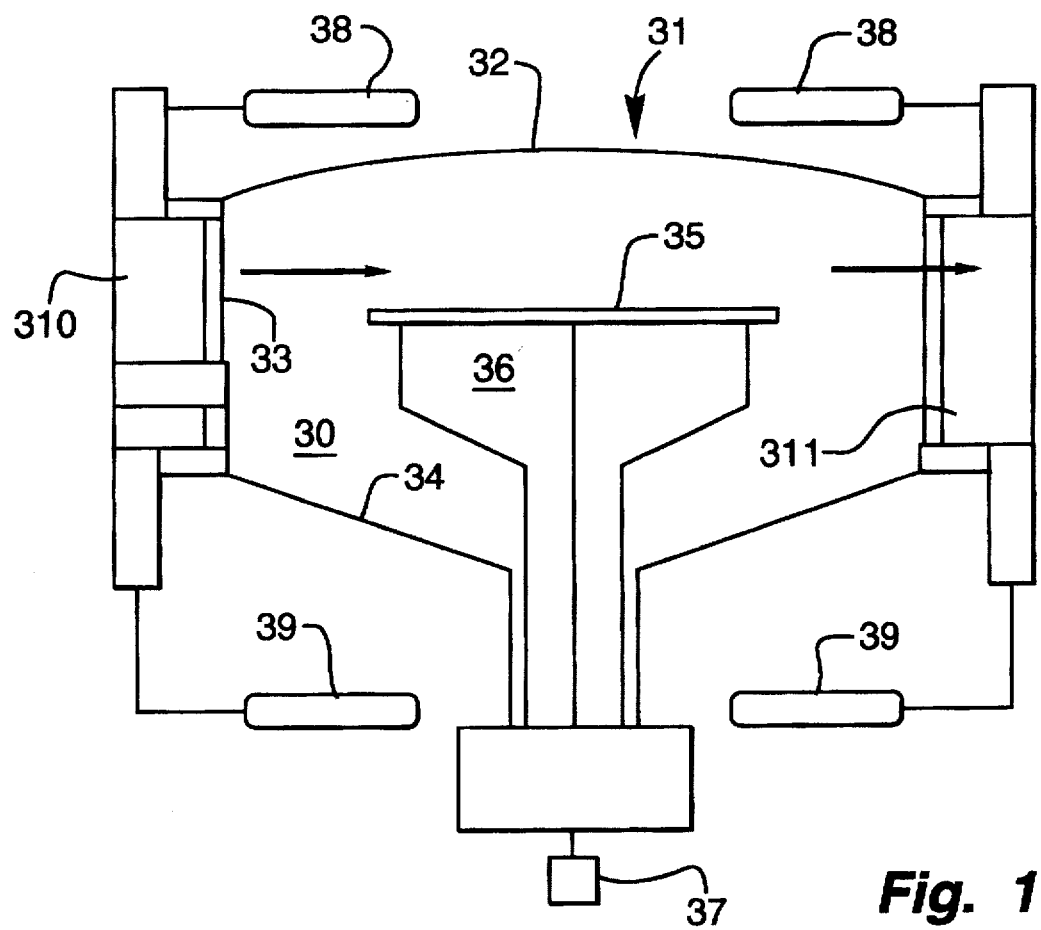
FIG. 1 is an illustration of a single wafer reactor useful in the press of the invention.

FIG. 1 illustrates a vacuum chamber 31 useful herein wherein polysilicon is deposited on only one substrate at a time. The reactor 31 has a top wall 32, side walls 33 and a bottom wall 34 that define a reaction chamber 30 into which a single substrate such as a semiconductor wafer 35 can be loaded. The wafer 35 is mounted on a pedestal 36 that is rotated by a motor 37 to provide a time-averaged environment for the wafer 35 that is cylindrically symmetrical. The wafer 35 is heated by light from high intensity lamps 38 and 39. It is desirable that the top wall 32 and the bottom wall 34 be substantially transparent to light to enable the light from the lamps 38 and 39 to enter the chamber 30. Quartz is a particularly useful choice for the top and bottom walls 32 and 34 because it is transparent to light at visible and uv frequencies; it is a relatively high strength material that can support a large pressure differential between the low pressures of the interior of the reaction chamber and ambient pressure; and it has a low rate of outgassing.

Polysilicon precursor gases flow from a gas input port 310 and across the wafer 35 to an exhaust port 311. The gas input port 310 is in communication with a gas manifold (not shown) that provides a precursor gas or a mixture of precursor gases to enter the chamber 30 via a plurality of pipes into the input gas port 310. The spacial dispositions of these pipes, concentrations of the precursor gases and/or the flow rates of the precursor gases through the pipes are selected in known manner to produce precursor gas flow and concentration profiles that optimize processing uniformity. Although the rotation of the wafer 35 and thermal gradients caused by the heat from the lamps 38 and 39 can significantly affect the flow profile of gases within the vacuum chamber 30, the dominant shape of the flow profile is laminar from the gas input port 310 and across the wafer 35 to the exhaust port 311.

The above-described reactor can be a stand-alone reactor or can be a reactor connected to a central load lock chamber of a multi-unit system. For example, the silicon deposition chamber can be one chamber of an Endura 5500™ system of Applied Materials, Inc. of Santa Clara, Calif.

The precursor gases can include silane or disilane.

The silicon deposited in accordance with the invention can be amorphous or polysilicon, or a mixture of the two, depending, as is known, on the temperature of deposition. The silicon can be deposited on various patterned or stepped substrate layers, including patterned layers (trenches) in silicon oxide, silicon nitride, crystalline silicon and the like. The silicon can also be deposited over conductive lines on the surface, either metal lines or metal silicide lines, providing only that the conductive material be able to withstand the temperature of deposition without flowing or otherwise changing its physical or chemical properties or close tolerances.

The key to the invention is carefully controlling the growth rate of the polysilicon layer to between about 500 angstroms/minute and about 2000 angstroms/minute, preferably between about 1000 angstroms/minute and about 1500 angstroms/minute. Lower growth rates tend to be unnecessarily slow and, therefore, commercially undesirable. Higher growth rates tend to result in lower step coverages.

While it is possible to control the growth rate of the polysilicon layer by adjusting the flow rates of the precursor gases alone, it is generally simpler and easier to control the growth rate of the polysilicon layer by adjusting the temperature and pressure within the vacuum chamber.

In general, the temperature and pressure are interrelated with respect to silicon growth rates; the lower the temperature, the higher the pressure needs to be to achieve a preselected silicon deposition rate. The silicon deposition rate is selected depending on the aspect ratio of the step sought to be covered, with lower deposition rates preferred for higher aspect ratio steps.

Desirably, the growth rate of the polysilicon layer can be controlled to achieve a "step coverage" greater than 80%, preferably greater than 90%, and most preferably greater than 95%. The deposition rate is chosen so as to maximize the step coverage.

The invention will be further illustrated by the following examples, but the invention is not means to be limited to the details described therein.

EXAMPLES

Comparative Example A

Figure 2:
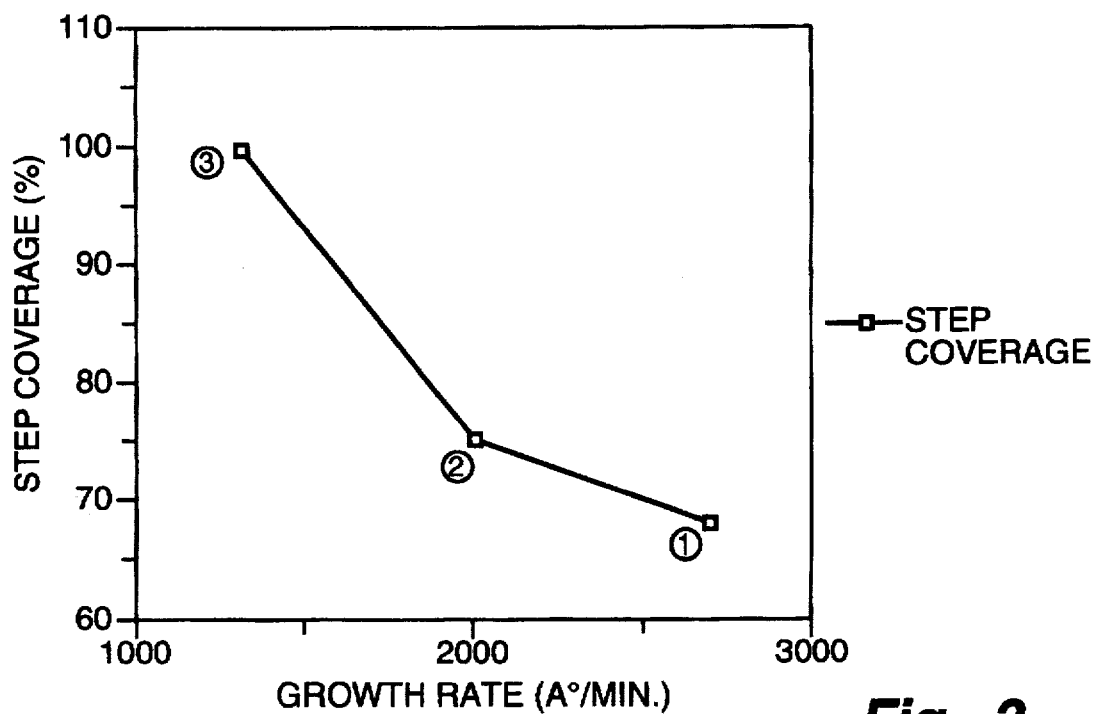
FIG. 2 is a graph of data comparing the results of the method of the present invention with the results of comparative methods.

A silicon semiconductor wafer having a patterned silicon oxide layer thereon with an aspect ratio of about 2.5 was charged to a vacuum chamber as in FIG. 1. A gas flow of 520 sccm of $SiH_4$ mixed with 4 slm of $H_2$ was started. The pressure within the vacuum chamber was maintained at about 80 Torr and the temperature was maintained at about 670° C. The silicon growth rate was measured and found to be about 2700 angstroms/minute but the average step coverage was found to be only about 70%. Point 1 on the graph of FIG. 2 illustrates these deposition results.

Comparative Example B

The procedure of Example A was followed except that the gas flow was 520 sccm of $SiH_4$ mixed with 7.5 slm of $H_2$. The pressure within the vacuum chamber was again maintained at about 80 Torr, and the temperature was maintained at about 670° C. The silicon growth rate was measured and found to be about 2000 angstroms/minute. The average step coverage was found to be only about 75%. Point 2 on the graph of FIG. 2 illustrates these results.

Example 1

The procedure of Example B was followed except that the pressure within the vacuum chamber was maintained at about 25 Torr and the temperature was maintained at about 670° C. The silicon growth rate was measured and found to be about 1400 angstroms/minute and the average step coverage was found to be about 100%. Point 3 on the graph of FIG. 2 illustrates these results. Thus when the reactor conditions were changed to reduce the deposition rate, improved step coverage was obtained.

Example 2

The procedure of Example 1 was followed except that the pressure within the vacuum chamber was maintained at about 150 Torr and the temperature was maintained at about 640° C. The silicon growth rate was measured and again found to be about 1400 angstroms/minute and the average step coverage was again found to be about 100%. Thus comparable step coverage was obtained at higher pressures and lower temperature conditions than those of Example 1.

The foregoing describes in detail several preferred embodiments of the invention. The foregoing should not be construed, however, as limiting the invention to the particular embodiments described. Those skilled in the art will recognize numerous other embodiments as equivalents thereof. For example, a mixture of amorphous and polysilicon, or even amorphous silicon, can be deposited under various conditions of temperature and pressure onto various substrates. The nature of the substrate is limited only by the deposition temperatures. The invention is meant only to be limited by the appended claims.

What is claimed is:

1. A thermal chemical vapor deposition method for forming a polysilicon layer over a stepped surface of a substrate whose aspect ratio is at least 1.0 consisting essentially of introducing a continuous flow of silicon precursor gases into a vacuum chamber containing said substrate, while adjusting the flow rates and concentrations of the precursor gases and adjusting the temperature and the pressure within the vacuum chamber so as to control the growth rate of the polysilicon layer on the substrate to between about 500 angstroms/minute and about 2000 angstroms/minute, such that step coverage of said patterned surface of over 80% is obtained.

2. The method of claim 1 wherein the growth rate of the polysilicon layer on the substrate is controlled to between about 1000 angstroms/minute and about 1500 angstroms/minute.

3. The method of claim 1 wherein the aspect ratio of the step is greater than about 2.5.

4. The method of claim 1 wherein the aspect ratio of the step is greater than about 5.0.

5. The method of claim 1, wherein the temperature within the vacuum chamber is maintained between about 635° C. and about 645° C. and wherein the pressure within the vacuum chamber is maintained between about 140 Torr and about 160 Torr.

6. The method of claim 1, wherein the temperature within the vacuum chamber is maintained between about 660° C. and about 680° C. and wherein the pressure within the vacuum chamber is maintained between about 20 Torr and about 30 Torr.

7. The method of claim 1, wherein the precursor gases are selected from the group consisting of silane and disilane.

8. The method of claim 1, wherein the precursor gas is silane.

9. The method of claim 1 wherein said substrate is a silicon wafer having a trench formed therein.

10. A thermal chemical vapor deposition method for forming a polysilicon layer over a stepped surface of a substrate, having at least one step whose aspect ratio is at least 1.0, consisting essentially of introducing a continuous flow of silicon precursor gases into a vacuum chamber containing the substrate while adjusting the flow rate and concentrations of the precursor gases, the temperature and the pressure within the vacuum chamber so as to control the growth rate of the polysilicon layer on the substrate to between about 1000 angstroms/minute and about 1500 angstroms per minute;

such that polysilicon is deposited on the substrate to an average step coverage of over 80%.

11. The method of claim 10, wherein the average step coverage on the substrate is greater than about 95%.

12. The method of claim 10 wherein said substrate is a silicon wafer having a trench formed therein.

* * * * *